US012752371B1

(12) United States Patent
Wells Torres et al.

(10) Patent No.: US 12,752,371 B1
(45) Date of Patent: Oct. 6, 2026

(54) FEMTOSECOND LASER SURFACE PROCESSING FOR CONTROLLED FILL AND TARGETED DEPOSITION

(71) Applicant: Honeywell Federal Manufacturing & Technologies, LLC, Kansas City, MO (US)

(72) Inventors: Sabrina Marie Wells Torres, Lee's Summit, MO (US); Connor Daniel Pearson, Overland Park, KS (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

(21) Appl. No.: 18/930,338

(22) Filed: Oct. 29, 2024

(51) Int. Cl.

| | |
|---|---|
| ***B23K 26/0622*** | (2014.01) |
| ***B01L 3/00*** | (2006.01) |
| ***B23K 26/00*** | (2014.01) |
| ***B23K 26/352*** | (2014.01) |
| ***B23K 26/40*** | (2014.01) |
| ***B23K 26/53*** | (2014.01) |
| ***B23K 103/00*** | (2006.01) |
| ***B81B 1/00*** | (2006.01) |
| ***B81C 1/00*** | (2006.01) |
| ***G01N 30/60*** | (2006.01) |

(52) U.S. Cl.
CPC ........ *B23K 26/0624* (2015.10); *B01L 3/5027* (2013.01); *B23K 26/0006* (2013.01); *B23K 26/355* (2018.08); *B23K 26/40* (2013.01); *B23K 26/53* (2015.10); *B81B 1/00* (2013.01); *B81C 1/00119* (2013.01); *B81C 1/00206* (2013.01); *G01N 30/6095* (2013.01); *B01L 3/502707* (2013.01); *B01L 3/502715* (2013.01); *B01L 3/50273* (2013.01); *B01L 2300/161* (2013.01); *B23K 2103/50* (2018.08); *B81C 2201/0143* (2013.01)

(58) Field of Classification Search
CPC ............. B01L 3/502707; B01L 3/5027; B01L 3/502715; B01L 2300/161; B01L 3/50273; B23K 26/0624; B23K 26/355; B81C 1/00119; B81C 1/00206; B81C 2201/0143; G01N 30/6095
See application file for complete search history.

(56) References Cited

U.S. PATENT DOCUMENTS

| | | | | |
|---|---|---|---|---|
| 11,534,727 B2 * | 12/2022 | Link | G01N 33/5375 | |
| 2002/0023840 A1 * | 2/2002 | Johnson | G01N 27/44791 | 204/601 |
| 2006/0024504 A1 * | 2/2006 | Nelson | B29C 59/16 | 427/532 |
| 2021/0031190 A1 * | 2/2021 | Babcock | B01L 3/502707 | |
| 2023/0166253 A1 * | 6/2023 | Torres | B01F 33/30351 | 422/503 |
| 2025/0108372 A1 * | 4/2025 | Salem | B01L 3/50273 | |

* cited by examiner

*Primary Examiner* — Steven W Crabb
*Assistant Examiner* — Fahmida Ferdousi
(74) *Attorney, Agent, or Firm* — Erise IP, P.A.

(57) ABSTRACT

Systems, methods, devices, and structures for providing selective fluid wicking using surface modification provided by a femtosecond laser processing technique. The surface modification may form a plurality of microstructures, which may be configured to encourage wicking, prevent wicking, or alter a fluid wicking rate based on the specific type of microstructures formed.

18 Claims, 4 Drawing Sheets

FEMTOSECOND LASER SURFACE PROCESSING FOR CONTROLLED FILL AND TARGETED DEPOSITION

STATEMENT OF GOVERNMENT SUPPORT

This invention was made with government support under contract number DE-NA-0002839 awarded by the United States Department of Energy/National Nuclear Security Administration. The government has certain rights in the invention.

BACKGROUND

1. Field

Embodiments of the present disclosure relate to femtosecond laser surface processing. More specifically, embodiments of the present disclosure relate to controlled fill and targeted deposition using femtosecond laser techniques.

2. Related Art

Fluid-based systems such as microfluidic channels and electronics that use fluid-based processing, such as, for example, solder joints may incorporate fluid disposed at particular points or areas along a surface. As an example, a solder joint may include heated solder fluid deposited onto a specific area to provide a connection to electronic components. In cases where solder fluid bleeds onto other surfaces, issues may arise, such as solder shorts, as well as other undesirable effects. As another example, fluids such as an adhesive fluid may be disposed on a surface to provide adhesion between the surface and another surface, another component, or another material layer. In such instances, it may be desirable that the adhesive be maintained at a particular portion of the surface. Accordingly, it may be beneficial to prevent the adhesive fluid from flowing into some other portion of the surface.

SUMMARY

Embodiments of the present disclosure solve the above-mentioned problems by providing a femtosecond laser processing technique to selectively provide a modified surface that either encourages fluid wicking or prevents fluid wicking depending on a plurality of microstructures formed on the modified surface.

In some aspects, the techniques described herein relate to a process of femtosecond laser surface processing, the process including: providing a substrate including a surface; prior to applying a process fluid onto the surface, selectively applying, using a femtosecond laser technique, a surface modification to a portion of the surface, the surface modification forming a plurality of microstructures on the portion of the surface, wherein the plurality of microstructures are configured to prevent wicking of the process fluid onto the portion of the surface; wicking the process fluid onto the surface; and preventing wicking at the portion of the surface using the plurality of microstructures.

In some aspects, the techniques described herein relate to a substrate surface provided by a femtosecond laser surface processing process, the substrate surface including: at least one channel disposed through a portion of the substrate surface; and a selectively modified surface applied to the substrate surface using a femtosecond laser technique, the selectively modified surface including a plurality of microstructures disposed on the substrate surface, at least a portion of the plurality of microstructures operable to prevent wicking of a process fluid.

In some aspects, the techniques described herein relate to a process of femtosecond laser surface processing, the process including: providing a substrate including a surface; prior to applying a process fluid onto the surface, selectively applying, using a femtosecond laser technique, a surface modification to a portion of the surface, the surface modification forming a plurality of microstructures on the portion of the surface, wherein the plurality of microstructures are configured to encourage wicking of the process fluid onto the portion of the surface; and wicking the process fluid onto the portion of the surface.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present disclosure will be apparent from the following detailed description of the embodiments and the accompanying drawing figures.

BRIEF DESCRIPTION OF THE DRAWING FIGURES

Embodiments of the present disclosure are described in detail below with reference to the attached drawing figures, wherein.

Figure 1:
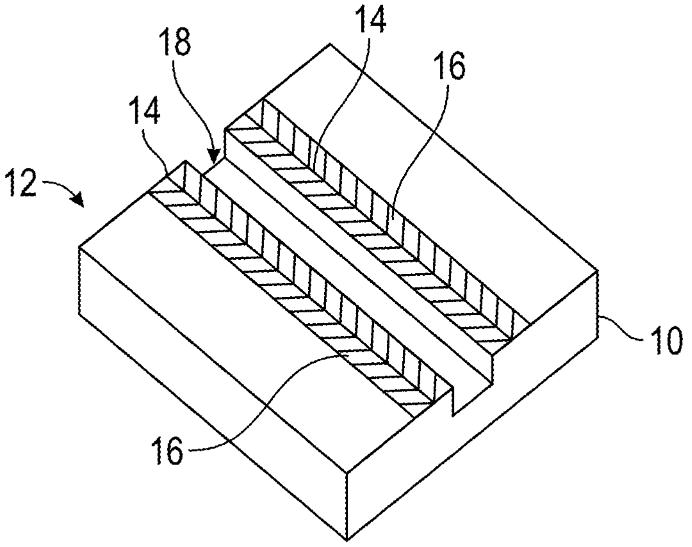
FIG. 1 illustrates an exemplary substrate relating to some embodiments.

The drawing figures do not limit the present disclosure to the specific embodiments disclosed and described herein. The drawings are not necessarily to scale, emphasis instead being placed upon clearly illustrating the principles of the present disclosure.

DETAILED DESCRIPTION

The following detailed description references the accompanying drawings that illustrate specific embodiments in which the present disclosure can be practiced. The embodiments are intended to describe aspects of the present disclosure in sufficient detail to enable those skilled in the art to practice the present disclosure. Other embodiments can be utilized and changes can be made without departing from the scope of the present disclosure. The following detailed description is, therefore, not to be taken in a limiting sense. The scope of the present disclosure is defined only by the appended claims, along with the full scope of equivalents to which such claims are entitled.

In this description, references to “one embodiment,” “an embodiment,” or “embodiments” mean that the feature or features being referred to are included in at least one embodiment of the technology. Separate references to “one embodiment,” “an embodiment,” or “embodiments” in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the technology can include a variety of combinations and/or integrations of the embodiments described herein.

Embodiments of the present disclosure contemplate femtosecond laser surface modifications to selectively control wicking of one or more process fluids on a substrate surface. Surface modifications are contemplated that form a plurality of microstructures with tunable fluid wicking effects. For example, a first surface modification may include hydrophilic microstructures while a second surface modification includes hydrophobic microstructures.

FIG. 1 illustrates a portion of an exemplary substrate 10 relating to some embodiments. Substrate 10, for example, may be any of a microfluidic chip substrate, an electronic chip substrate, a semiconductor chip substrate, a circuit board substrate, a substrate of a printed wiring board, a printed wiring assembly, or any other suitable form of substrate. The substrate 10 may comprise a surface 12, for example, the surface 12 may include a top external surface of the substrate 10, as shown. The surface 12 comprises one or more modified portions, such as first modified portion 14 and second modified portion 16, as shown. Additionally, in some embodiments, the surface 12 includes at least one channel 18 disposed on the surface 12. For example, channel 18 may include a substantially elongated, cut-out, or recessed portion of the surface 12. In some such embodiments, channel 18 may be formed using an additive manufacturing or subtractive manufacturing technique. For example, embodiments are contemplated in which channel 18 is formed using a laser processing technique, such as a femtosecond laser surface processing technique, as will be described in further detail below.

In some embodiments, surface 12 may include a silane layer, or another suitable chemical modifier, such as a surfactant or acrylates, deposited thereon. For example, surface 12 may be coated with silane prior to the formation of channel 18 or the formation of surface microstructures. Alternatively, in some embodiments, the silane layer may be deposited onto the surface 12 surrounding channel 18 after the channel is formed. Further, in some embodiments, the channel 18 and surrounding area may be coated with silane or another suitable chemical modifier. In some embodiments, the surface 12 itself comprises a silane material. In some embodiments, the silane layer may be formulated to be laser ablated by a femtosecond laser technique to provide specific surface structures and modifications. In some embodiments, a heat transfer fluid may be applied to the channel 18. Alternatively, in some embodiments, the process fluid may be configured to provide heat transfer effects. For example, a process fluid may be flowed through the channel to heat or cool the channel. In some embodiments, the channel 18 may be heated or cooled to facilitate a particular chemical reaction within the channel. Further, in some embodiments, additional heating mechanisms and devices are contemplated, for example, to heat the process fluid or at least a portion of the substrate 10. Alternatively, or additionally, one or more cooling devices are also contemplated.

In some embodiments, channel 18 comprises a microfluidic channel having a depth of around 60 to 70 micrometers. In some embodiments, the depth of the microfluidic channel may be selected between 50 micrometers and 200 micrometers. Alternatively, in some embodiments, larger channel depths are contemplated, for example, the depth of the microfluidic channel may be up to 1 millimeter or within the millimeter range. Further, embodiments are contemplated in which other channel depths not explicitly disclosed may be used. Further still, in some embodiments, channel 18 may include a smooth surface. Alternatively, embodiments are contemplated in which a surface modification may be applied to the surface. For example, a plurality of mound microstructures may be formed on at least a portion of the channel surface.

In some embodiments, one or more modified portions of the surface 12 include any combination of hydrophobic, hydrophilic, superhydrophobic, and superhydrophilic surface structures. For example, embodiments are contemplated in which first modified portion 14 comprises a plurality of hydrophobic microstructures, and second modified portion 16 comprises a plurality of hydrophilic microstructures. Alternatively, embodiments are contemplated in which only hydrophobic structures are included or only hydrophilic structures are included. Further, in some embodiments, the respective modified portions 14 and 16 may be oriented and positioned differently than as shown. For example, the first modified portion 14 and the second modified portion 16 are shown disposed around the outer edges of the channel 18. However, it should be understood that the modified portions may be included elsewhere on the substrate surface 12 instead of, or in addition to, being disposed around channel 18.

In at least an exemplary embodiment, first modified portion 14 comprises hydrophobic microstructures and is disposed at or adjacent to the edge of channel 18 to prevent a process fluid from flowing into channel 18. For example, the hydrophilic modified portion 16 may wick the processing fluid and encourage flow along the hydrophilic modified portion 16, while the hydrophobic modified portion 14 prevents further wicking into the channel by providing a flow barrier to prevent (or impede) flow of the process fluid into the channel 18. Further, embodiments are contemplated in which one or more hydrophobic modified portions 14 may be used to prevent the processing fluid from flowing onto or into other components. Alternatively, or in addition, one or more hydrophilic modified portions 16 may be used to encourage the flowing of the processing fluid toward or onto other components or into particular channels.

Broadly, any suitable process fluids are contemplated for which controlled wicking thereof is desired. In particular, the process fluid, as described herein, may include any of a solder fluid, an underfill material, an adhesive fluid, solvents, printed resins, cleaning solutions, as well as combinations thereof. Further, it should be understood that additional embodiments are contemplated in which the channel depth of the channel 18 may be increased. For example, in some embodiments, the channel depth may be double the depth as shown in FIG. 1.

Figure 2:
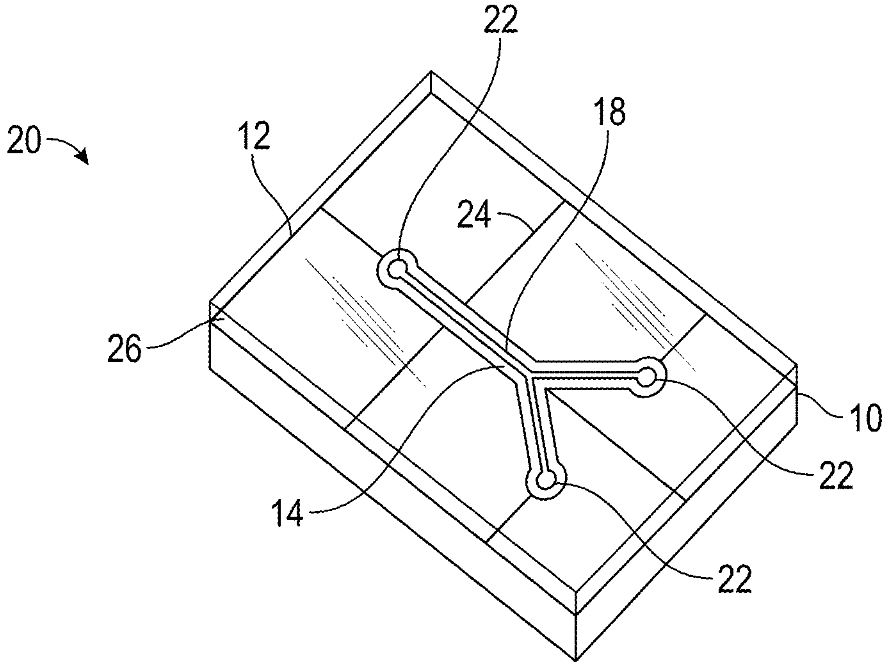
FIG. 2 illustrates an exemplary microfluidic chip relating to some embodiments.

FIG. 2 illustrates an exemplary microfluidic chip 20 relating to some embodiments. In some embodiments, the microfluidic chip 20 comprises any combination of substrate 10, surface 12, first modified portion 14, and channel 18. In some embodiments, the microfluidic chip 20 includes one or more fluid ports 22, as shown. The one or more fluid ports 22 may be configured to receive a fluid such as any of a working fluid, an adhesive, or another suitable fluid. For example, in some embodiments, the ports 22 are fluidly coupled to channel 18 such that the fluid ports 22 are configured to provide or remove fluid from channel 18. In some embodiments, the fluid ports 22 are configured to receive one or more fluid connection adapters. For example, fluid connection adapters comprising threaded connection points or quick-disconnect implements may be coupled to the fluid ports 22.

In some embodiments, the microfluidic chip 20 further comprises one or more adhesive channels 24 disposed on the surface 12. For example, the adhesive channels 24 may comprise recessed portions cutaway from the surface 12. In some embodiments, the adhesive channels 24 are etched into the surface 12 using laser etching or another suitable etching technique. The adhesive channels 24 provide a fluid path for adhesive. For example, an adhesive substance may be applied to the surface 12 and any excess adhesive may be expelled through the adhesive channels 24.

In some embodiments, the microfluidic chip 20 further comprises a cover 26 disposed over at least a portion of the surface 12. In some embodiments, cover 26 may be comprised of a material that is at least partially transparent such that the surface is visible beneath cover 26. For example, in some embodiments, cover 26 comprises a transparent glass material such that other components of the microfluidic chip 20 are visible.

Figure 3:
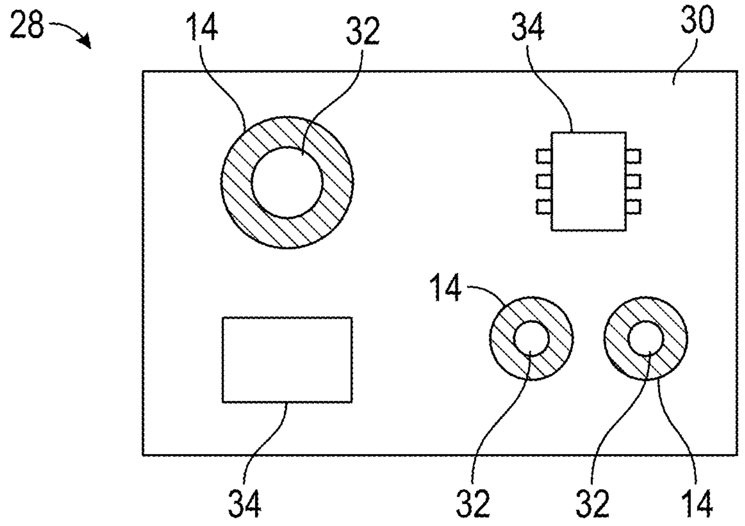
FIG. 3 illustrates an exemplary electronic device relating to some embodiments.

FIG. 3 illustrates an exemplary electronic device 28 relating to some embodiments. In some embodiments, the electronics device 28 comprises a circuit board 30, for example, any of a printed circuit board (PCB), printed wiring board (PWB), printed wiring assembly (PWA), or the like. The electronics device 28 may include one or more connection areas 32 may be disposed on (or within) the surface of the circuit board 30. For example, one or more connection areas may be configured to receive electronic components such as processors, electronic chips, microelectronics components, transistors, resistors, capacitors, amplifiers, connection ports, electronic sensors, or the like.

In some embodiments, modified surface portion 14 is applied around the connection area 32, as shown. For example, the modified portion 14 may comprise a hydrophobic modified portion designed to prevent the wicking of one or more fluids, such as solder, from connection area 32. As such, connection area 32 may receive solder for connecting electronic components, while modified portion 14 prevents the solder from flowing onto other portions of the circuit board 30. Alternatively, or additionally, in some embodiments, the connection area 32 may be configured to receive an underfill material. For example, an underfill substance, such as, an epoxy or adhesive may be deposited onto the connection area 32 to bond or fill gaps between the surface and one or more other components.

In some embodiments, the electronics device 28 includes one or more additional components 34, which may include any of processors, electronics chips, microelectronics components, transistors, resistors, capacitors, amplifiers, connection ports, electronic sensors, or the like. As shown and described above, the hydrophobic modified portion 14 may be disposed in an area surrounding the connection area 32. Alternatively, or in addition, in some embodiments, connection area 32 may include hydrophilic modified portion 16 disposed thereon to encourage the wicking of solder for connecting electrical components. Similarly, the hydrophilic modified portion 16 may be configured to encourage wicking of other fluids such as an underfill substance or adhesive.

Figure 4:
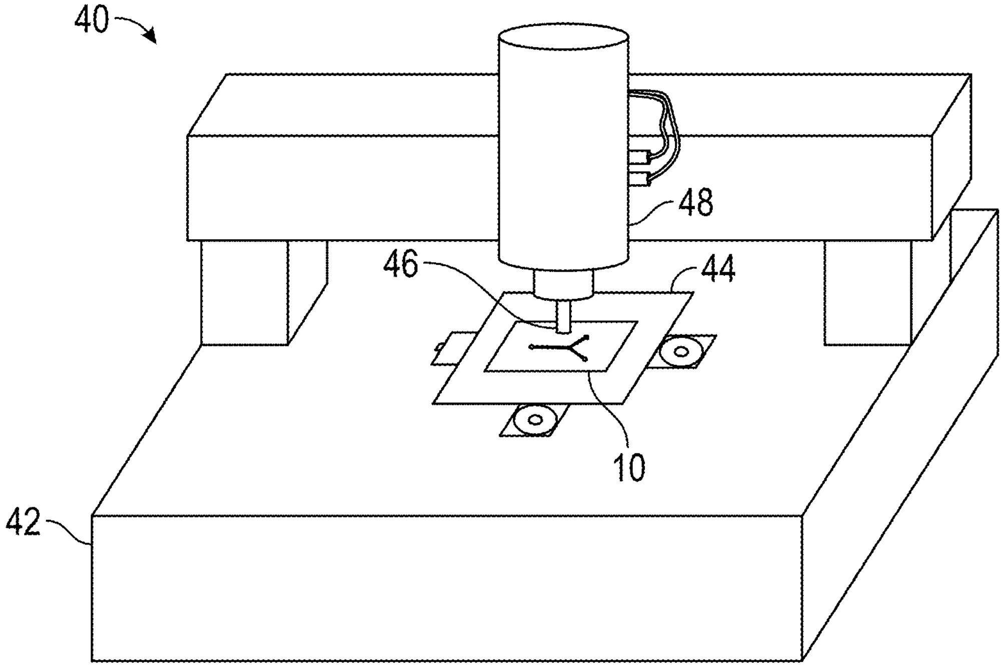
FIG. 4 illustrates an exemplary computer numerical control (CNC) system relating to some embodiments.

FIG. 4 illustrates an exemplary computer numerical control (CNC) system 40 relating to some embodiments. In some embodiments, the CNC system 40 comprises any combination of a base 42, a work platform 44, a laser head 46, and one or more support structures 48, as shown. For example, in some embodiments, the CNC system 40 comprises a femtosecond laser system configured to apply a femtosecond laser finish to a substrate or device. For example, the femtosecond laser system may be configured to provide a femtosecond laser surface modification to any of the substrate 10 (as shown), the microfluidic chip 20, or the electronics device 28.

In some embodiments, the base 42 provides a supporting structure or housing for the CNC system 40. For example, in some embodiments, the base 42 comprises a housing that covers at least a portion of the CNC system 40. Further, in some embodiments, the work platform 44 is configured to hold the substrate 10 or another device being modified. In some embodiments, the platform 44 is moveable with respect to the base 42. For example, platform 44 may include or be coupled to one or more drive motors, such as servomotors configured to rotate or translate platform 44 along one or more respective axes. In some embodiments, platform 44 comprises a 3-axis platform configured to be translated with respect to each of an X, Y, and Z axis. In some embodiments, the platform 44 may be configured to rotate one or more axes with respect to the base 42. In other embodiments, platform 44 may be configured for 4-, 5-, or 6-axis control.

In some embodiments, a laser generation source may be integrated into at least a portion of the CNC system 40. For example, in some embodiments, a laser source is integrated into the supporting structure 48. Alternatively, or in addition, a laser generation source may be integrated into the base 42. Further, embodiments are contemplated in which the laser generation source is structurally separate from the CNC system 40 and coupled to the laser head 46, for example, via a fiber optic cable connected therebetween.

The CNC system 40 may be utilized to manufacture any combination of the components described herein, such as substrate 10 (shown in FIG. 1), microfluidic chip 20 (shown in FIG. 2), or electronic device 28 (shown in FIG. 3). For example, the laser head 46 may be configured to apply a femtosecond laser surface finish onto at least a portion of any of the substrate 10, the microfluidic chip 20, or the electronics device 28. In some embodiments, the CNC system 40 is operable to provide any combination of a hydrophobic and a hydrophilic surface finish by altering the microstructure geometry of the surface.

Figure 5:
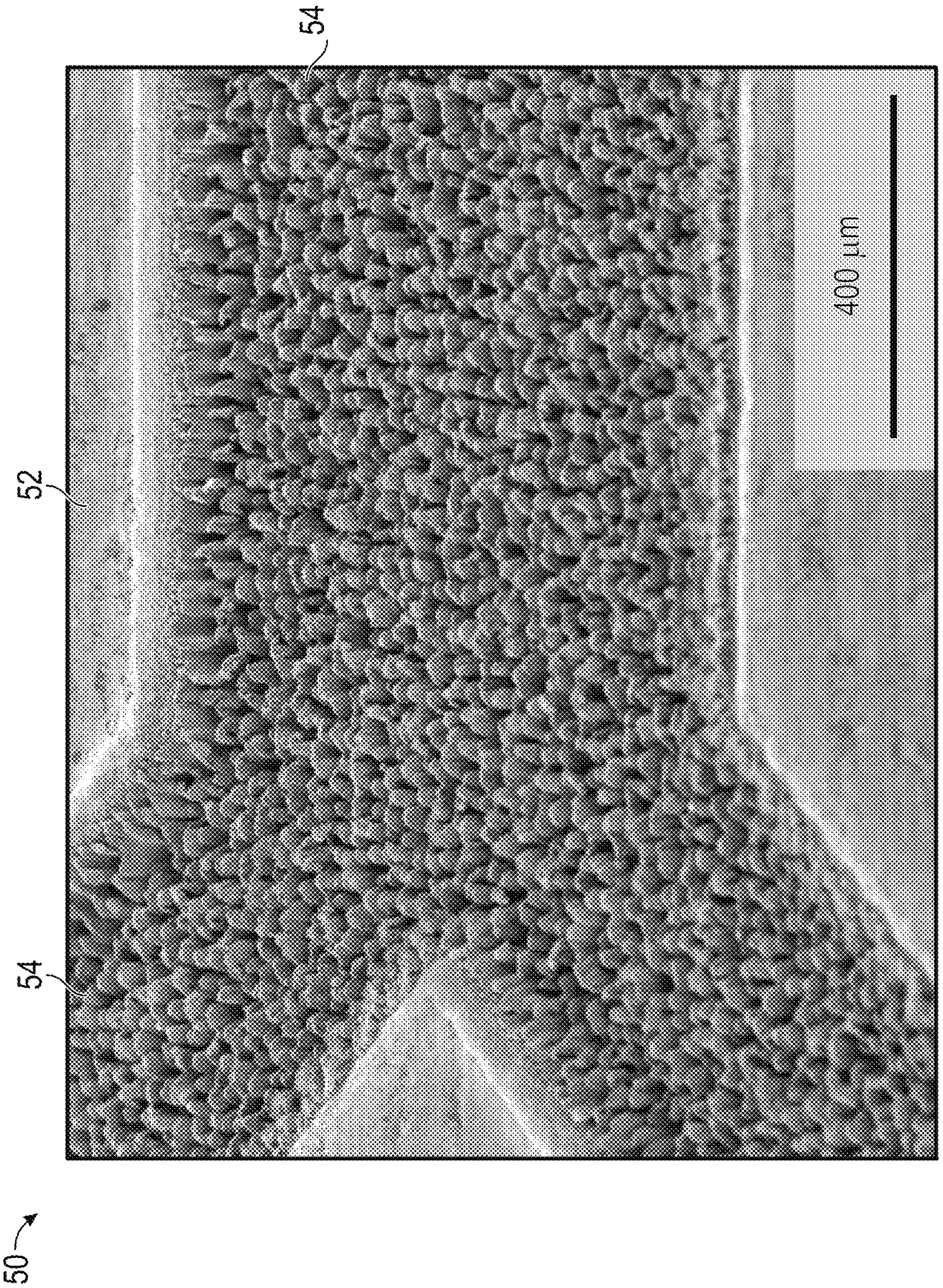
FIG. 5 illustrates an exemplary microstructure surface relating to some embodiments.

FIG. 5 illustrates an exemplary microstructure surface 50 relating to some embodiments. The microstructure surface 50 includes a first surface portion 52 and a second surface portion 54. In some embodiments, the first surface portion 52 comprises an unmodified portion without a femtosecond laser surface modification, while the second surface portion 54 comprises a modified surface portion altered by a femtosecond laser surface finishing process. Alternatively, in some embodiments, both the first surface portion and the second surface portion include surface modification. For example, one of first surface portion 52 and second surface portion 54 may include a hydrophobic surface modification, while the other includes a hydrophilic surface modification.

The microstructure surface 50, as illustrated in FIG. 5, may include a plurality of mound microstructures disposed on the second surface portion 54. In some embodiments, the mound microstructures are generated using the femtosecond laser processing technique to subtract material from the surface until the mound structures are formed.

The plurality of microstructures included on the modified portions of the surface may include any combination of mound structures, groove structures, lattice structures, honeycomb structures, rod structures, as well as other suitable microstructures not explicitly described herein.

Figure 6:
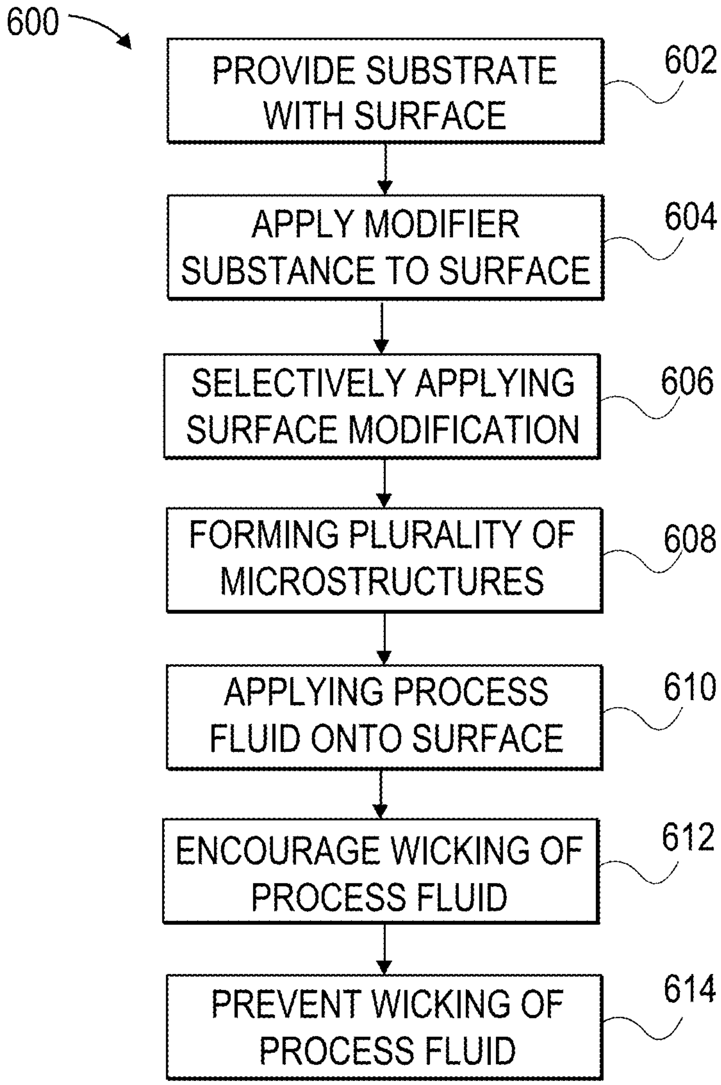
FIG. 6 illustrates an exemplary method relating to some embodiments.

FIG. 6 illustrates one example of a method 600 of femtosecond laser surface processing relating to some embodiments. In some embodiments, at least a portion of the steps of method 600 may be performed using a femtosecond laser system, such as the CNC system 40, as described above, or any other suitable laser or subtractive manufacturing technique; for the sake of brevity, the process is generally referred to herein as the femtosecond laser processing technique. Initially, at step 602, a substrate having a surface is provided. For example, the substrate may include any of the substrate 10, the microfluidic chip 20, or the electronics device 28 having a surface, such as surface 12 described herein.

In some embodiments, a modifier substance is applied to the surface at step 604. In some embodiments, the modifier substance is a silane substance. For example, a thin layer of fluorinated silane may be deposited onto an unprocessed surface using a gas-phase deposition technique. However, it should be understood that other suitable modifier substances are also contemplated, as well as other deposition techniques. For example, other modifier substances and deposition techniques may be used for relatively low surface tension liquids such as ultraviolet glue. In some embodiments, the modifier substance is applied internal to the channel. Alternatively, or additionally, the modifier substance, such as a silane substance may be applied to an area surrounding the channel.

At step 606, one or more surface modifications are selectively applied using a femtosecond laser processing technique. In some embodiments, the surface modification is applied to one or more specific portions of the area of the surface. For example, in some embodiments, a first surface modification is applied to a first surface portion, while a second surface modification distinct from the first surface modification is applied to a second surface portion. Additionally, in some embodiments, the femtosecond laser processing technique is used to provide other modifications or to form other surface elements, such as a channel. For example, the same femtosecond laser system may be used to both form a channel in the substrate and provide the surface modification. In some embodiments, the surface modification is applied after deposition of the modifier substance at step 604.

In some embodiments, the surface modification is applied prior to applying a process fluid onto the surface. Broadly, the surface modification may be chosen to alter the interaction between the surface and the process fluid in a desired way. For example, as described in further detail below, the surface modification may cause the process fluid to wick onto the modified portion or to prevent wicking onto the modified portion. Further still, embodiments are contemplated in which a wicking rate is tuned or adjusted (i.e., selectively increased or decreased) responsive to the surface modification. For example, a first surface modification may be chosen to reduce the wicking rate for a first region, while a second surface modification may be chosen to increase the wicking rate for a second region. In some such embodiments, the wicking rate may be tuned by appropriately selecting any combination of the type of microstructures formed, the density of the microstructures, or other microstructure parameters (such as height, depth, and porosity). Specific surface modifications may be chosen to cause the modified surface to attract or repel the process fluid. For example, in a water-based system, modifications may be chosen to render certain regions hydrophilic and other regions hydrophobic. Other forms of altering the interaction between the surface and the process fluid are also contemplated as being within the scope of the invention.

At step 608, a plurality of microstructures is formed using the femtosecond laser technique. The plurality of microstructures is formed on the surface to be modified via, for example, subtractive processing of the surface, such as laser ablation using the femtosecond laser. The plurality of microstructures may include any combination of microstructure mounds, grooves, lattices, rods, or other suitable microstructures. In some embodiments, different types of microstructures are formed for different surface regions. For example, a first surface portion may include a first type of microstructure, while a second surface portion may include a second type of microstructure. In some such cases, for example, the first type of microstructure may provide a hydrophobic fluid effect, while the second type of microstructure may provide a hydrophilic fluid effect. It should be understood that steps 606 and 608 may occur simultaneously. For example, the plurality of microstructures may be formed as part of the surface modification applied at step 606. However, in some embodiments, a plurality of distinct surface modifications may be applied at different times. For example, a first surface modification may be used to form a first type of microstructure, and a second surface modification may be used to form a second type of microstructure that is distinct from the first type. As yet another example, a first hydrophobic surface portion may be applied followed by a second hydrophilic surface portion.

In some embodiments, the specific type of microstructures may be determined based on the type of process fluid and interaction therewith. For example, a first microstructure may provide a hydrophobic effect with a solder fluid but may have a different interaction with an adhesive. Accordingly, the microstructures used may be selected based on the type of process fluid as well as the desired interaction between the surface and the fluid.

In some embodiments, the plurality of microstructures includes a superhydrophobic structure, such as a superhydrophobic barrier configured to provide a flow barrier to a process fluid, such as a superhydrophobic ridge. Alternatively, or additionally, in some embodiments, the plurality of microstructures include superhydrophilic structures configured to provide a flow path or a higher flow rate for the process fluid as compared to a standard surface, a hydrophobic surface, or a hydrophilic surface.

At step 610, a process fluid is applied onto the surface. The process fluid may include any of a solder fluid, an underfill, an adhesive fluid, or any other process fluid and may be applied onto a specific area of the surface. In some embodiments, the process fluid may be deposited into a fluid port coupled to the substrate or surface. Alternatively, for example, the process fluid may include a wetted solder fluid applied by heating solder material positioned on the surface. In other embodiments, the surface may be dipped in the process fluid and removed, such that the fluid is attracted to desired regions and repelled from undesired regions based on the surface modifications applied at step 606.

In some embodiments, at step 612, wicking of process fluid is encouraged onto at least a portion of the surface. In some embodiments, wicking is encouraged by way of hydrophilic microstructures formed into the portion of the surface using the femtosecond laser technique. Alternatively, embodiments are contemplated in which wicking is provided passively, and hydrophilic microstructures are not included. In some embodiments, the modified surface may be configured to provide wicking of the process fluid into a specific direction or onto a specific area of the surface.

In some embodiments, at step 614, wicking of the process fluid is prevented onto at least another portion of the surface. In some embodiments, wicking is prevented by way of hydrophobic microstructures formed into the portion of the surface using the femtosecond laser technique. Alternatively, embodiments are contemplated in which wicking is prevented passively by encouraging wicking to one or more other portions, such that hydrophobic microstructures may not be included. In some embodiments, wicking of the process fluid is prevented using a superhydrophobic barrier disposed on the surface.

In some embodiments, portions of method 600 may be skipped, removed, or separated into two or more distinct processes. For example, in some embodiments, steps 602 through step 608 may be included in an initial manufacturing process, while step 610 through step 614 may be included in a subsequent process in which the modified surface is used. Further, in some embodiments, additional steps may be included. For example, in some embodiments, a heat transfer fluid is added to the channel to adjust a temperature of the channel or substrate. For example, in some embodiments, a heat transfer fluid is flowed through the channel to heat the channel to thereby facilitate a particular temperature dependent chemical reaction.

In some embodiments, one or more additional steps may be included for applying a coating or other surface finish to the substrate surface. For example, in some embodiments, a hydrophobic coating may be deposited onto the surface. However, it should be understood that, in some embodiments, a hydrophobic fluid effect may be produced without a hydrophobic material coating. Instead, some embodiments of the present disclosure contemplate providing hydrophobicity using femtosecond-laser-generated microstructures rather than relying on hydrophobic material properties. As such, in some embodiments, a hydrophobic material coating is not included.

Clause 1. A process of femtosecond laser surface processing, the process comprising: providing a substrate comprising a surface; prior to applying a process fluid onto the surface, selectively applying, using a femtosecond laser technique, a surface modification to a portion of the surface, the surface modification forming a plurality of microstructures on the portion of the surface, wherein the plurality of microstructures are configured to prevent wicking of the process fluid onto the portion of the surface; wicking the process fluid onto the surface; and preventing wicking at the portion of the surface using the plurality of microstructures.

Clause 2. The process of clause 1, wherein the femtosecond laser technique is configured to apply a first type of surface modification to a first portion of the surface to form a first plurality of microstructures and second type of surface modification to a second portion of the surface to form a second plurality of microstructures, and wherein the second plurality of microstructures is distinct from the first plurality of microstructures.

Clause 3. The process of any of clause 1 or 2, further comprising: tuning the plurality of microstructures to adjust a wicking rate of the process fluid at the portion of the surface.

Clause 4. The process of any of clause 1 through 3, further comprising: depositing a chemical modifier onto the surface at an area surrounding a channel disposed on the surface.

Clause 5. The process of any of clause 1 through 4, wherein the silane substance is deposited using a gas-phase evaporation technique.

Clause 6. The process of any of clause 1 through 5, wherein the plurality of microstructures comprises a superhydrophobic barrier configured to provide a flow barrier to the process fluid.

Clause 7. The process of any of clause 1 through 6, wherein the plurality of microstructures comprises one or more mound structures formed by the femtosecond laser technique.

Clause 8. A substrate surface provided by a femtosecond laser surface processing process, the substrate surface comprising: at least one channel disposed through a portion of the substrate surface; and a selectively modified surface applied to the substrate surface using a femtosecond laser technique, the selectively modified surface comprising a plurality of microstructures disposed on the substrate surface, at least a portion of the plurality of microstructures operable to prevent wicking of a process fluid.

Clause 9. The substrate surface of clause 8, wherein the process fluid comprises an underfill material.

Clause 10. The substrate surface of clause 8 or 9, wherein the process fluid comprises an adhesive.

Clause 11. The substrate surface of any of clause 8 through 10, wherein the process fluid comprises a heat transfer fluid.

Clause 12. The substrate surface of any of clause 8 through 11, wherein the at least one channel comprises a microfluidic channel.

Clause 13. The substrate surface of any of clause 8 through 12, wherein the plurality of microstructures includes a mound structure formed by the femtosecond laser technique.

Clause 14. The substrate surface of any of clause 8 through 13, the plurality of microstructures further comprising a hydrophilic portion configured to encourage wicking of the process fluid.

Clause 15. A process of femtosecond laser surface processing, the process comprising: providing a substrate comprising a surface; prior to applying a process fluid onto the surface, selectively applying, using a femtosecond laser technique, a surface modification to a portion of the surface, the surface modification forming a plurality of microstructures on the portion of the surface, wherein the plurality of microstructures are configured to encourage wicking of the process fluid onto the portion of the surface; and wicking the process fluid onto the portion of the surface.

Clause 16. The process of clause 15, further comprising: selectively applying, using the femtosecond laser technique, a subsequent surface modification to a subsequent portion of the surface, the surface modification forming a subsequent plurality of microstructures on the subsequent portion of the surface.

Clause 17. The process of any of clause 15 or 16, wherein the subsequent plurality of microstructures are hydrophobic.

Clause 18. The process of any of clause 15 through 17, further comprising: preventing wicking of the process fluid at the subsequent portion of the surface using the subsequent plurality of microstructures.

Clause 19. The process of any of clause 15 through 18, wherein the process fluid comprises an adhesive.

Clause 20. The process of any of clause 15 through 19, wherein the portion of the surface comprises a plurality of adhesive channels configured to remove excess adhesive.

Clause 21. The process of any of clause 15 through 20, further comprising applying a heat transfer fluid to the surface.

Although the present disclosure has been described with reference to the embodiments illustrated in the attached drawing figures, it is noted that equivalents may be employed and substitutions made herein without departing from the scope of the present disclosure as recited in the claims.

Having thus described various embodiments of the present disclosure, what is claimed as new and desired to be protected by Letters Patent includes the following:

1. A process of femtosecond laser surface processing, the process comprising:

providing a substrate comprising a surface;

selectively applying, using a femtosecond laser technique, a first surface modification to a first portion of the surface, the first surface modification forming a plurality of hydrophobic microstructures on the first portion of the surface, wherein the plurality of hydrophobic microstructures are configured to prevent wicking of an underfill material onto the first portion of the surface;

selectively applying, using the femtosecond laser technique, a second surface modification to a second portion of the surface, the second surface modification forming a plurality of hydrophilic microstructures on the second portion of the surface, wherein the plurality of hydrophilic microstructures are configured to cause wicking of the underfill material onto the second portion of the surface, wherein the second portion of the surface comprises a connection area operable to receive at least one electronic component for connection to the surface;

applying the underfill material onto the surface; and subsequent to applying the first surface modification and the second surface modification, wicking the underfill material onto the second portion of the surface at the connection area using the plurality of hydrophilic microstructures while preventing wicking of the underfill material onto the first portion of the surface using the plurality of hydrophobic microstructures.

2. The process of claim 1, wherein the plurality of hydrophilic microstructures is tuned to adjust a wicking rate of the underfill material at the second portion of the surface.

3. The process of claim 1, further comprising:

depositing a silane substance onto the surface internal to a channel disposed on the surface and at an area surrounding the channel.

4. The process of claim 3, wherein the silane substance is deposited using a gas-phase evaporation technique.

5. The process of claim 1, wherein the plurality of hydrophobic microstructures comprises a superhydrophobic barrier configured to provide a flow barrier to the underfill material.

6. The process of claim 1, wherein the plurality of hydrophobic microstructures comprises one or more mound structures formed by the femtosecond laser technique.

7. The process of claim 1, further comprising:

applying a solder fluid onto the surface.

8. A substrate surface provided by a femtosecond laser surface processing process, the substrate surface comprising:

a solder fluid applied onto the substrate surface;

a surface modification selectively applied to a portion of the substrate surface using a femtosecond laser technique to form a plurality of hydrophobic microstructures disposed on the substrate surface, the plurality of hydrophobic microstructures operable to prevent wicking of the solder fluid onto the portion of the substrate surface, wherein the plurality of hydrophobic microstructures is positioned at least partially around a connection area on the substrate surface to prevent the solder fluid from flowing out of the connection area; and a second surface modification selectively applied to a second portion of the substrate surface, the second surface modification including a plurality of hydrophilic microstructures configured to cause wicking of the solder fluid.

9. The substrate surface of claim 8, further comprising an underfill material applied onto the substrate surface.

10. The substrate surface of claim 8, further comprising a heat transfer fluid applied onto the substrate surface.

11. The substrate surface of claim 8, further comprising a microfluidic channel disposed on the substrate surface.

12. The substrate surface of claim 8, wherein the plurality of hydrophobic microstructures includes a mound structure formed by the femtosecond laser technique.

13. The substrate surface of claim 8, further comprising:

at least one channel disposed in the substrate surface; and wherein the plurality of hydrophilic microstructures is disposed in the at least one channel, the plurality of hydrophilic microstructures operable to cause wicking of the solder fluid through the at least one channel.

14. A process of femtosecond laser surface processing, the process comprising:

providing a substrate comprising a surface with a connection area defined thereon, the connection area configured to receive at least one electronic component for connection to the surface;

selectively applying, using a femtosecond laser technique, a surface modification to a portion of the surface at the connection area, the surface modification forming a plurality of hydrophilic microstructures on the portion of the surface at the connection area, wherein the plurality of hydrophilic microstructures are configured to cause wicking of a solder fluid onto the portion of the surface at the connection area;

applying the solder fluid onto the surface at the connection area;

subsequent to applying the surface modification, wicking the solder fluid onto the portion of the surface at the connection area using the plurality of hydrophilic microstructures; and selectively applying, using the femtosecond laser technique, a subsequent surface modification to a subsequent portion of the surface, the subsequent surface modification forming a plurality of hydrophobic microstructures on the subsequent portion of the surface.

15. The process of claim 14, wherein the plurality of hydrophobic microstructures are configured to prevent wicking of the solder fluid.

16. The process of claim 15, further comprising:

preventing wicking of the solder fluid at the subsequent portion of the surface using the plurality of hydrophobic microstructures.

17. The process of claim 14, wherein the portion of the surface comprises a plurality of channels configured to remove excess fluid.

18. The process of claim 14, wherein the surface modification is applied to a microfluidic channel on the surface such that the plurality of hydrophilic microstructures causes wicking of the solder fluid through the microfluidic channel.

* * * * *